US012199165B2

(12) United States Patent
Kim et al.

(10) Patent No.: US 12,199,165 B2
(45) Date of Patent: Jan. 14, 2025

(54) SEMICONDUCTOR DEVICE AND ELECTRONIC APPARATUS INCLUDING THE SEMICONDUCTOR DEVICE

(71) Applicant: Samsung Electronics Co., Ltd., Suwon-si (KR)

(72) Inventors: Changhyun Kim, Seoul (KR); Seunggeol Nam, Suwon-si (KR); Keunwook Shin, Yongin-si (KR); Dohyun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 334 days.

(21) Appl. No.: 17/670,949

(22) Filed: Feb. 14, 2022

(65) Prior Publication Data

US 2023/0070266 A1    Mar. 9, 2023

(30) Foreign Application Priority Data

Sep. 9, 2021 (KR) .......... 10-2021-0120546

(51) Int. Cl.
*H01L 29/45* (2006.01)
*H01L 29/06* (2006.01)
(Continued)

(52) U.S. Cl.
CPC .......... *H01L 29/45* (2013.01); *H01L 29/0665* (2013.01); *H01L 29/41733* (2013.01);
(Continued)

(58) Field of Classification Search
CPC ................. H01L 29/45; H01L 29/0665; H01L 29/41733; H01L 29/41791;
(Continued)

(56) References Cited

U.S. PATENT DOCUMENTS 10,134,628 B2   11/2018   Song et al.
10,325,812 B2    6/2019   Jacob
(Continued)

FOREIGN PATENT DOCUMENTS

EP           3096347 A1    11/2016
KR   10-2013-0070962 A     6/2013
(Continued)

OTHER PUBLICATIONS

Extended Search Report dated Sep. 8, 2022 issued in related European patent application No. 22164077.4.
(Continued)

*Primary Examiner* — Mohammad A Rahman
(74) *Attorney, Agent, or Firm* — HARNESS, DICKEY & PIERCE, P.L.C.

(57) ABSTRACT

A semiconductor device includes a first source/drain structure including a first semiconductor region and a first electrode in electrical contact with the first semiconductor region; a second source/drain structure including a second semiconductor region and a second electrode in electrical contact with the second semiconductor region; a channel between the first semiconductor region and the second semiconductor region; and a gate structure including a gate insulating film covering the channel and a gate electrode covering the gate insulating film. The first source/drain structure further includes a silicide film between the first semiconductor region and the first electrode and a conductive barrier between the silicide film and the first electrode. The conductive barrier includes a conductive two-dimensional material.

24 Claims, 15 Drawing Sheets

(51) Int. Cl.
  *H01L 29/417* (2006.01)
  *H01L 29/423* (2006.01)
  *H01L 29/78* (2006.01)
  *H01L 29/786* (2006.01)

(52) U.S. Cl.
  CPC .. *H01L 29/41791* (2013.01); *H01L 29/42392* (2013.01); *H01L 29/7851* (2013.01); *H01L 29/78696* (2013.01)

(58) Field of Classification Search
  CPC ........... H01L 29/42392; H01L 29/7851; H01L 29/78696; H01L 23/485; H01L 29/41725; H01L 29/41766; H01L 29/785; H01L 29/456; H01L 21/8238; H01L 27/092; H01L 27/11807; H01L 29/04; H01L 29/16; H01L 29/18; H01L 29/22–2206; H01L 29/36; B81C 2203/0728; B81C 2203/0735; B81C 2203/0742
  See application file for complete search history.

(56) References Cited

U.S. PATENT DOCUMENTS

| | | | |
|---|---|---|---|
| 11,508,664 | B2 | 11/2022 | Shin et al. |
| 2019/0165120 | A1 | 5/2019 | Sato |
| 2021/0082829 | A1 | 3/2021 | Yang et al. |
| 2021/0257474 | A1 | 8/2021 | Lee et al. |
| 2022/0102522 | A1* | 3/2022 | Dewey ............ H01L 21/823475 |
| 2022/0238677 | A1* | 7/2022 | Hsieh .................. H01L 29/0673 |
| 2022/0262903 | A1 | 8/2022 | Lee et al. |
| 2022/0328671 | A1 | 10/2022 | Kim et al. |

FOREIGN PATENT DOCUMENTS

| | | |
|---|---|---|
| KR | 10-2017-0014870 A | 2/2017 |
| KR | 10-2020-0126925 A | 11/2020 |
| KR | 10-2370695 B1 | 3/2022 |
| KR | 10-2022-0141651 A | 10/2022 |

OTHER PUBLICATIONS

Keeyoung Jun et al., 'Development of TiSiN CVD process using $TiCl_4/SiH_4/NH_3$ chemistry for ULSI anti-oxidation barrier applications,' *Science and Technology of Advanced Materials*, vol. 5, 2004, pp. 549-554.

Min-Hyun Lee et al., 'Two-Dimensional Materials Inserted at the Metal/Semiconductor Interface: Attractive Candidates for Semiconductor Device Contacts,' *Nano Lett.*, 2018, vol. 18, pp. 4878-4884.

Sang Won Kim et al., 'Graphene-Based Etch Resist for Semiconductor Device Fabrication,' *ACS Appl. Nano Mater.*, 2020, vol. 3, pp. 4635-4641.

\* cited by examiner

SEMICONDUCTOR DEVICE AND ELECTRONIC APPARATUS INCLUDING THE SEMICONDUCTOR DEVICE

CROSS-REFERENCE TO RELATED APPLICATION

This application is based on and claims priority under 35 U.S.C. § 119 to Korean Patent Application No. 10-2021-0120546, filed on Sep. 9, 2021, in the Korean Intellectual Property Office, the disclosure of which is incorporated by reference herein in its entirety.

BACKGROUND

1. Field

The present disclosure relates to a semiconductor device and an electronic apparatus including the same, and more particularly, to a semiconductor device having a diffusion prevention barrier having a small thickness and an electronic apparatus including the same.

2. Description of the Related Art

Transistors are semiconductor devices that perform an electrical switching role and are used in various integrated circuit devices including memories, driving Integrated Circuits (ICs), logic devices, and the like. In order to increase the degree of integration of an integrated circuit device, a space occupied by a transistor provided therein is rapidly reduced. Due to the reduced space, as the thickness of layers constituting the transistor becomes thinner, during or after forming the source/drain electrodes, gases or metals used for forming the source/drain electrodes tend to diffuse into other surrounding layers. Accordingly, research has been conducted to reduce the size of the transistor while maintaining performance.

SUMMARY

Provided are semiconductor devices having a high performance while further reducing their size, and electronic apparatuses including the semiconductor devices.

Additional aspects will be set forth in part in the description which follows and, in part, will be apparent from the description, or may be learned by practice of the presented embodiments of the disclosure.

According to an embodiment, a semiconductor device may include a first source/drain structure including a first semiconductor region and a first electrode in electrical contact with the first semiconductor region; a second source/drain structure including a second semiconductor region and a second electrode in electrical contact with the second semiconductor region; a channel between the first semiconductor region and the second semiconductor region; and a gate structure including a gate insulating film covering the channel and a gate electrode covering the gate insulating film. The first source/drain structure may further include a silicide film and a conductive barrier. The silicide film may be between the first semiconductor region and the first electrode. The conductive barrier may be between the silicide film and the first electrode. The conductive barrier may include a conductive two-dimensional material.

In some embodiments, a thickness of the conductive barrier may be in a range of about 0.3 nm to about 2 nm.

In some embodiments, the first electrode may include a same two-dimensional material as the conductive barrier, and the first electrode may be integrally formed with the conductive barrier.

In some embodiments, the first electrode may include at least one of W, Co, Cu, Ru, Mo, Rh, Ir, and an alloy thereof.

In some embodiments, the silicide film may be a mixture of silicon and at least one of W, Ti, Co, Ni, Pt, and an alloy thereof.

In some embodiments, the two-dimensional material may include at least one of graphene, black phosphorus, amorphous boron nitride, two-dimensional hexagonal boron nitride (h-BN), and phosphorene.

In some embodiments, the semiconductor device may further include a substrate, and the first semiconductor region and the second semiconductor region are may protrude from an upper surface of the substrate.

In some embodiments, the first electrode may include a first portion located inside the first semiconductor region and a second portion protruding above an upper surface of the first semiconductor region.

In some embodiments, the conductive barrier may surround a first portion of the first electrode. The conductive barrier may be between the first semiconductor region and the first portion of the first electrode. The silicide film may surround the conductive barrier. The silicide film may be between the first semiconductor region and the conductive barrier.

In some embodiments, a diameter of the second portion of the first electrode may be greater than a diameter of the first portion of the first electrode so that the second portion of the first electrode may cover at least a portion of an upper surface of the conductive barrier.

In some embodiments, the channel may protrude from the upper surface of the substrate and may have a shape extending in a first direction.

In some embodiments, the first electrode may extend in a second direction that is different from the first direction.

In some embodiments, the gate insulating film may surround side surfaces of the channel and an upper surface of the channel; and the gate electrode may surround side surfaces of the gate insulating film and an upper surface of the gate insulating film.

In some embodiments, the gate structure may further include a two-dimensional semiconductor material layer between the gate insulating film and the gate electrode. The two-dimensional semiconductor material layer may surround side surfaces of the gate insulating film and an upper surface of the gate insulating film. The gate electrode may surround side surfaces of the two-dimensional semiconductor material layer and an upper surface of the two-dimensional semiconductor material layer.

In some embodiments, the channel may be spaced apart from the upper surface of the substrate and the channel may extend in a first direction.

In some embodiments, the channel may include a plurality of channel elements spaced apart at a distance from each other in a second direction that is different from the first direction.

In some embodiments, the gate insulating film may include a plurality of gate insulating films spaced apart from each other and respectively surrounding the plurality of channel elements.

In some embodiments, the gate electrode may protrude from the upper surface of the substrate and may surround the plurality of gate insulating films.

In some embodiments, the gate structure may further include a plurality of two-dimensional semiconductor material layers respectively surrounding the plurality of gate insulating films. The gate electrode may protrude from the upper surface of the substrate and may surround the plurality of two-dimensional semiconductor material layers.

According to embodiment, an electronic apparatus may include at least one semiconductor device. Each semiconductor device may include a first source/drain structure, a second source/drain structure, a channel, and a gate structure. The first source/drain structure may include a first semiconductor region and a first electrode in electrical contact with the first semiconductor region. The second source/drain structure may include a second semiconductor region and a second electrode in electrical contact with the second semiconductor region. The channel may be between the first semiconductor region and the second semiconductor region. The gate structure may include a gate insulating film covering the channel and a gate electrode covering the gate insulating film. The first source/drain structure may include a silicide film and a conductive barrier. The silicide film may be between the first semiconductor region and the first electrode and the conductive barrier may be between the silicide film and the first electrode. The conductive barrier may include a conductive two-dimensional material.

According to an embodiment, a semiconductor device may include a first source/drain structure and a second source/drain structure spaced apart from each other and connected to opposite ends of a channel, and a gate structure on the channel and spaced apart from the first source/drain structure and the second source/drain structure. The first source/drain structure and the second source/drain structure respectively may include a first silicide film on a first semiconductor region and a second silicide film on a second semiconductor region, a first electrode electrically connected to the first silicide film and a second electrode electrically connected to the second silicide film, and a first conductive barrier between the first electrode and the first silicide film and a second conductive barrier between the second electrode and the second silicide film. The first conductive barrier and the second conductive barrier may include a conductive two-dimensional material. The gate structure may include a gate electrode and a gate insulating film between the gate electrode and the channel.

In some embodiments, the conductive two-dimensional material may include at least one of graphene, black phosphorus, amorphous boron nitride, two-dimensional hexagonal boron nitride (h-BN), and phosphorene.

In some embodiments, the first semiconductor region may surround the first silicide film. The second semiconductor region may surround the second silicide film.

In some embodiments, the semiconductor device may include a substrate. The first semiconductor region, the channel, and the second semiconductor region may protrude from an upper surface of the substrate. The first electrode may surround the first semiconductor region. The second electrode may surround the second semiconductor region. The gate electrode may surround the channel.

In some embodiments, the channel may include a plurality of channel elements spaced apart from each other.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
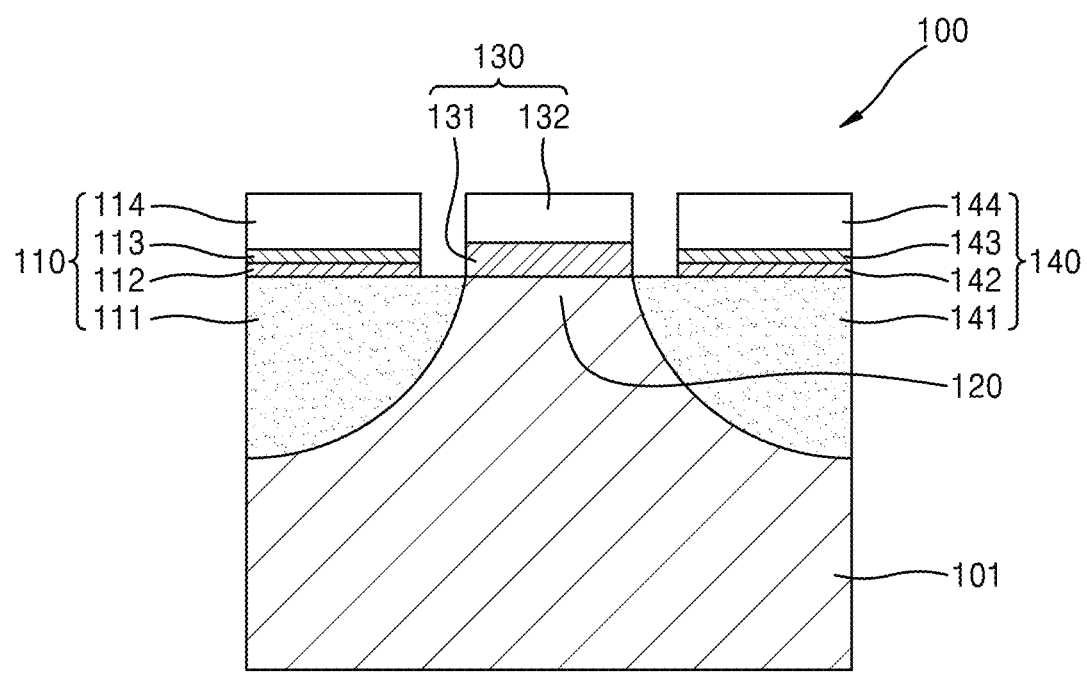
FIG. 1A is a schematic cross-sectional view illustrating a structure of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, a semiconductor device and an electronic apparatus including the same will be described in detail with reference to the accompanying drawings. In the drawings, like reference numerals refer to the like elements, and the size of each component may be exaggerated for clarity and convenience of description. The embodiments of inventive concepts are capable of various modifications and may be embodied in many different forms.

Hereinafter, when an element or layer is referred to as being "on" or "above" another element or layer, the element or layer may be directly on another element or layer or intervening elements or layers. The singular forms are intended to include the plural forms as well, unless the context clearly indicates otherwise. Also, it should be understood that, when a part "comprises" or "includes" a constituent element in the specification, unless otherwise defined, it is not excluding other elements but may further include other elements.

The term "above" and similar directional terms may be applied to both singular and plural. With respect to operations that constitute a method, the operations may be performed in any appropriate sequence unless the sequence of operations is clearly described, and the operations may not necessarily be performed in the order of sequence.

Also, in the specification, the term "units" or " . . . modules" denote units or modules that process at least one function or operation, and may be realized by hardware, software, or a combination of hardware and software.

Connections or connection members of lines between components shown in the drawings illustrate functional connections and/or physical or circuit connections, and the connections or connection members can be represented by replaceable or additional various functional connections, physical connections, or circuit connections in an actual apparatus.

The use of all examples or example terms is merely for describing the technical scope of inventive concepts in detail, and thus, the scope of inventive concepts is not limited by the examples or the example terms as long as it is not defined by the claims.

FIG. 1A is a schematic cross-sectional view illustrating a structure of a semiconductor device 100 according to an embodiment. Referring to FIG. 1A, the semiconductor device 100 according to an embodiment includes a first source/drain structure 110, a second source/drain structure 140, a channel 120 disposed between the first source/drain structure 110 and the second source/drain structure 140, and a gate structure 130 disposed on an upper surface of the channel 120 and between the first source/drain structure 110 and the second source/drain structure 140. In addition, the semiconductor device 100 may further include a substrate 101. The first source/drain structure 110 and the second source/drain structure 140 may be disposed on both sides of an upper surface of the substrate 101. The channel 120 may be a partial region of the substrate 101. Accordingly, it may be viewed that the gate structure 130 is disposed on the upper surface of the substrate 101 between the first source/drain structure 110 and the second source/drain structure 140.

The first source/drain structure 110 may include a first semiconductor region 111, a first silicide film 112 on the first semiconductor region 111, a first conductive barrier 113 on the first silicide film 112, and a first source/drain electrode 114 on the first conductive barrier 113. In addition, the second source/drain structures 140 may include a second semiconductor region 141, a second silicide film 142 on the second semiconductor region 141, a second conductive barrier 143 on the second silicide film 142, and a second source/drain electrode 144 on the second conductive barrier 143.

The first semiconductor region 111 and the second semiconductor region 141 may be doped with a first conductivity type, and the substrate 101 may be doped with a second conductivity type that is electrically opposite to the first conductivity type. For example, the substrate 101 may include a p-type semiconductor and the first semiconductor region 111 and the second semiconductor region 141 may include an n-type semiconductor, or the substrate 101 may include an n-type semiconductor and the first semiconductor region 111 and the second semiconductor region 141 may include a p-type semiconductor. The substrate 101 may be doped with a relatively low concentration in a range from about $10^{14}/cm^3$ to about $10^{18}/cm^3$, and the first semiconductor region 111 and the second semiconductor region 141 may be doped with a relatively high concentration in a range from about $10^{19}/cm^3$ to about $10^{21}/cm^3$ for low resistance. The first semiconductor region 111 and the second semiconductor region 141 may be formed by doping both sides of an upper region of the substrate 101, respectively. The upper region of the substrate 101, on which the first semiconductor region 111 and the second semiconductor region 141 are not formed, is the channel 120. Accordingly, the channel 120 may be disposed between the first semiconductor region 111 and the second semiconductor region 141.

The substrate 101, the first semiconductor region 111, and the second semiconductor region 141 may include at least one semiconductor material among, for example, a Group IV semiconductor, such as silicon (Si), germanium (Ge), or SiGe, or a Group III-V semiconductor, such as GaAs or GaP. When the substrate 101, the first semiconductor region 111, and the second semiconductor region 141 include Si, Ge, SiGe, etc., the substrate 101 may be doped with at least one dopant selected from B, Al, Ga, and In, and the first semiconductor region 111 and the second semiconductor region 141 may be doped with at least one dopant selected from P, As, and Sb. Then, the semiconductor device 100 becomes an n-channel metal oxide semiconductor field effect transistor (NMOS). Alternatively, on the contrary, the substrate 101 may be doped with at least one dopant selected from P, As, and Sb, and the first semiconductor region 111 and the second semiconductor region 141 may be doped with at least one dopant selected from B, Al, Ga, and In. Then, the semiconductor device 100 becomes a p-channel metal oxide semiconductor field effect transistor (PMOS).

In general, when a semiconductor and a metal are in direct contact, a contact resistance is increased at a contact surface of the semiconductor and the metal due to a high Schottky energy barrier at an interface between the semiconductor and the metal. The first silicide film 112 is disposed between the first semiconductor region 111 and the first source/drain electrodes 114 and may perform a role of reducing contact resistance between the first semiconductor region 111 and the first source/drain electrodes 114. Similarly, the second silicide film 142 is disposed between the second semiconductor region 141 and the second source/drain electrode 144 and may perform a role of reducing contact resistance between the second semiconductor region 141 and the second source/drain electrode 144. The first and second silicide films 112 and 142 may include a mixture or a compound of a metal material of the first and second source/drain electrodes 114 and 144 and silicon. For example, the first and second silicide films 112 and 142 may include a mixture or compound of silicon and at least one metal selected from W, Ti, Co, Ni, Pt, and an alloy thereof.

The first conductive barrier 113 may be disposed between the first silicide film 112 and the first source/drain electrodes 114 to limit and/or prevent diffusion of gas or metal into the first silicide film 112. For example, the first conductive barrier 113 may limit and/or prevent a gas material used for depositing the first source/drain electrodes 114 from contacting and reacting with the first silicide film 112, and limit and/or prevent a metal material of the first source/drain electrodes 114 from diffusing into the first silicide film 112. Similarly, the second conductive barrier 143 may be disposed between the second silicide film 142 and the second source/drain electrodes 144 to limit and/or prevent diffusion of gas or metal into the second silicide film 142. To this end, the first and second conductive barriers 113 and 143 may include a material having a relatively high physical or chemical stability not to be easily damaged. In addition, in order to keep a low resistance of the first and second source/drain structures 110 and 140, the first and second conductive barriers 113 and 143 may include a material having relatively good electrical conductivity.

For example, the first and second conductive barriers 113 and 143 may include a conductive two-dimensional (2D) material, such as graphene. Besides graphene, various 2D materials having conductivity may be used. For example, the 2D material used as the first and second conductive barriers 113 and 143 may include at least one selected from graphene, black phosphorus, amorphous boron nitride, and 2D hexagonal boron nitride (h-BN), and phosphorene. When a 2D material is used, the thickness of the first and second conductive barriers 113 and 143 may be reduced, and as a result, the size of the semiconductor device 100 may further be reduced while improving the performance of the semiconductor device 100. For example, the thickness of the first and second conductive barriers 113 and 143 may be in a range of about 0.3 nm to about 2 nm.

The first source/drain electrode 114 may be disposed on the first conductive barrier 113 to be in electrical contact with the first semiconductor region 111. In addition, the second source/drain electrode 144 may be disposed on the second conductive barrier 143 to be in electrical contact with the second semiconductor region 141. The first and second source/drain electrodes 114 and 144 may include, for example, at least one metal selected from W, Co, Cu, Ru, Mo, Rh, Ir, and an alloy thereof. Alternatively, the first and second source/drain electrodes 114 and 144 may include the same conductive 2D material as the first and second conductive barriers 113 and 143. In this case, the first source/drain electrode 114 may be integrally configured with the first conductive barrier 113, and the second source/drain electrode 144 may be integrally configured with the second conductive barrier 143.

The gate structure 130 may include a gate insulating film 131 covering an upper surface of the channel 120, and a gate electrode 132 covering an upper surface of the gate insulating film 131. The gate insulating film 131 may include a dielectric material, such as $SiO_2$, SiNx, $HfO_2$, $Al_2O_3$, etc., and the gate electrode 132 may include polysilicon, single crystal silicon, or the same metal material included in the first and second source/drain electrodes 114 and 144.

In FIG. 1A, although the semiconductor device 100 is illustrated as a field effect transistor having a planar channel 120, the present embodiment is not limited thereto. For example, technical aspects according to the embodiment described above may be applied to a FinFET, a gate-all-around FET (GAAFET), or a multi-bridge channel FET (MBCFET) having a three-dimensional channel structure.

Figure 1B:
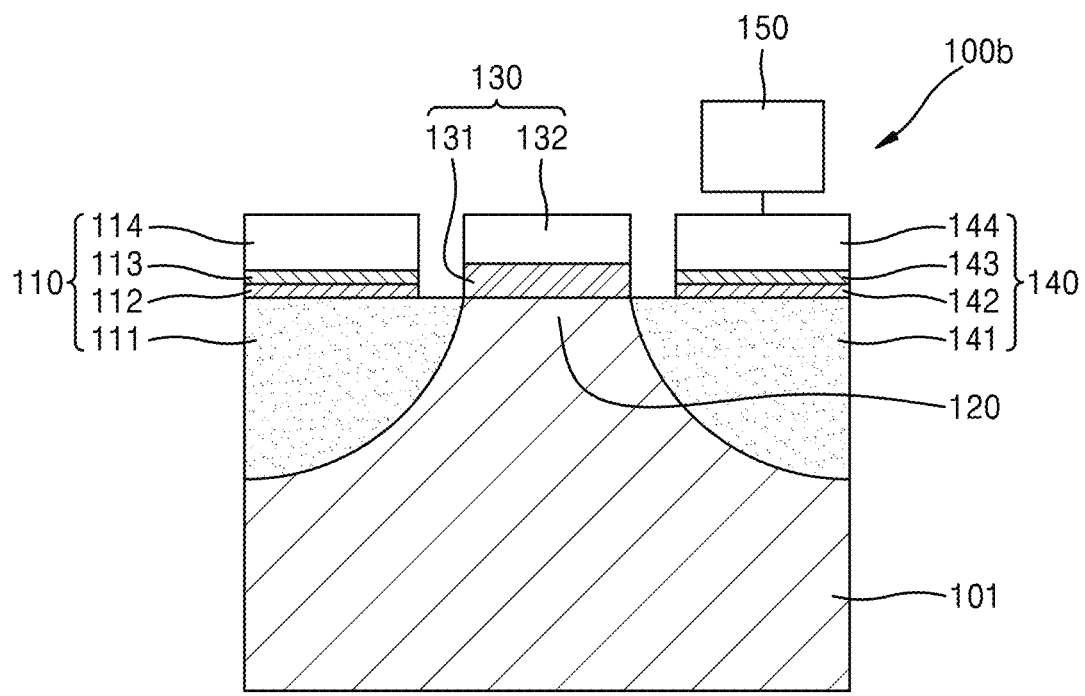
FIG. 1B is a schematic cross-sectional view illustrating a structure of a semiconductor device according to an embodiment.
Figure 2:
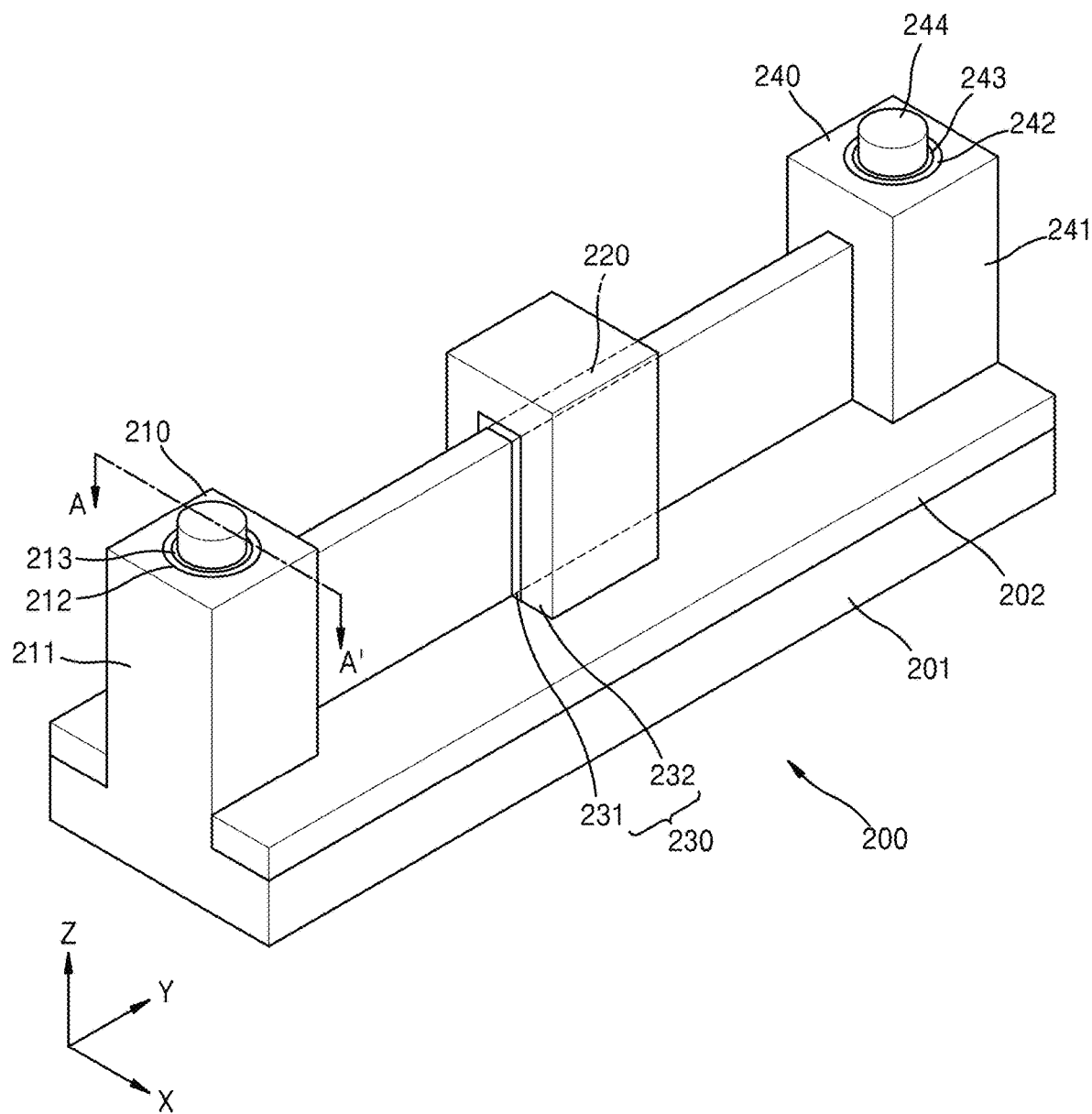
FIG. 2 is a schematic perspective view illustrating a structure of a semiconductor device according to another embodiment.

FIG. 1B is a schematic cross-sectional view illustrating a structure of a semiconductor device 100b according to an embodiment. Referring to FIG. 1B, the semiconductor device 100b may be the same as the semiconductor device 100 in FIG. 1A, except the semiconductor device 100b may further include a data storage element 150 connected to the second source/drain electrode 144 to provide a semiconductor memory device. The data storage element 150 may be capable of storing data corresponding to '1' or '0.' The data storage element 150 may be a capacitor or a magnetic tunnel junction, but is not limited thereto. FIG. 2 is a schematic cross-sectional view illustrating a structure of a semiconductor device 200 according to another embodiment. Referring to FIG. 2, the semiconductor device 200 may include a substrate 201, a first source/drain structure 210 protruding in a Z-direction from an upper surface of the substrate 201, a second source/drain structure 240 protruding in the Z-direction from the upper surface of the substrate 201, a channel 220 protruding in the Z-direction from the upper surface of the substrate 201 and having a bar shape extending in a Y-direction, and a gate structure 230 covering the channel 220 by surrounding the channel 220. The semiconductor device 200 may further include a device isolation film 202 to electrically isolate the semiconductor device 200 from another adjacent semiconductor device (not shown). The device isolation film 202 may include an insulating dielectric material, and may be disposed to extend in a Y-direction along both sides of the first source/drain structure 210, the channel 220, the gate structure 230, and the second source/drain structure 240 on the upper surface of the substrate 201. The semiconductor device 200 shown in FIG. 2 may include, for example, a FinFET.

The channel 220 may extend in the Y-direction and may be connected between the first source/drain structure 210 and the second source/drain structure 240. In other words, a first end of the channel 220 may contact the first source/drain structure 210 and a second end of the channel 220 may contact the second source/drain structure 240. The channel 220 may include a p-type semiconductor doped with a relatively low concentration or an n-type semiconductor doped with a relatively low concentration.

The gate structure 230 may include a gate insulating film 231 covering the channel 220 between the first source/drain electrode 210 and the second source/drain electrode 240, and a gate electrode 232 covering the gate insulating film 231. The gate insulating film 231 may be disposed to protrude from the upper surface of the substrate 201 to cover three surfaces of the channel 220, that is, both side surfaces and an upper surface of the channel 220. Also, the gate electrode 232 may be disposed to protrude from the upper surface of the substrate 201 to cover three surfaces of the gate insulating film 231, that is, both side surfaces and an upper surface of the gate insulating film 231.

In addition, the first source/drain structure 210 includes a first semiconductor region 211, a first source/drain electrode 214 disposed in the first semiconductor region 211, a first conductive barrier 213 disposed to surround the first source/drain electrode 214 in the first semiconductor region 211, and a first silicide film 212 disposed to surround the first conductive barrier 213 in the first semiconductor region 211. Similarly, the second source/drain structure 240 may include a second semiconductor region 241, a second source/drain electrode 244 disposed in the second semiconductor region 241, a second conductive barrier 243 disposed to surround the source/drain electrodes 244 in the second semiconductor region 241, and a second silicide film 242 disposed to surround the second conductive barrier 243 in the second semiconductor region 241.

The first semiconductor region 211 and the second semiconductor region 241 may be disposed to protrude from the upper surface of the substrate 201 in the Z-direction. The first semiconductor region 211 and the second semiconductor region 241 may include an n-type semiconductor doped with a relatively high concentration or a p-type semiconductor doped with a relatively high concentration. Portions of the first semiconductor region 211 and the second semiconductor region 241 may extend in the Y-direction to be connected to the channel 220. The portions of the first semiconductor region 211 and the second semiconductor region 241 connected to the channel 220 may have the same width as the channel 220 in the X-direction. Other portions of the first semiconductor region 211 and the second semiconductor region 241 opposite to the channel 220 may have a width greater than the width of the channel 220.

Figure 3:
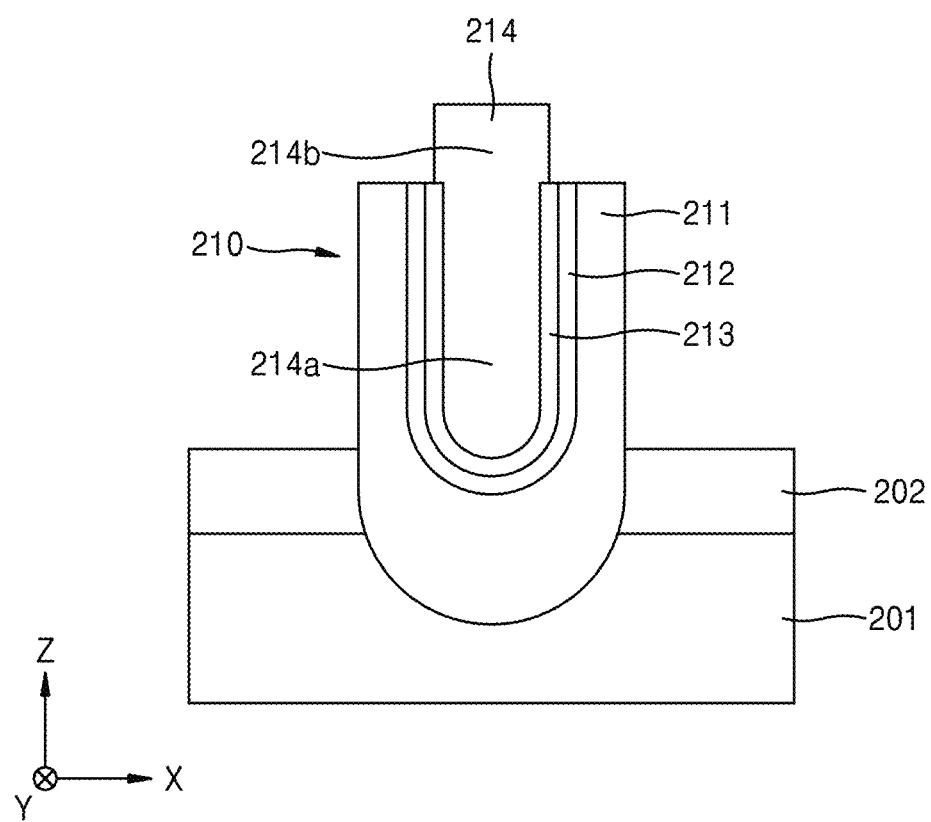
FIG. 3 is a schematic cross-sectional view illustrating another example structure of a first source/drain structure of the semiconductor device shown in FIG. 2.

FIG. 3 is a schematic cross-sectional view showing an example structure of the first source/drain structure 210 of the semiconductor device 200 shown in FIG. 2, in particular, a schematic cross-sectional view taken along line A-A' of the first source/drain structure 210. Referring to FIG. 3, the first source/drain electrode 214 may have a bar shape extending in the Z-direction that is different from the extending direction of the channel 220. The first source/drain electrode 214 may include a first portion 214a located inside the first semiconductor region 211 and a second portion 214b protruding in the Z-direction above an upper surface of the first semiconductor region 211. The first conductive barrier 213 may be disposed to surround the first portion 214a of the first source/drain electrode 214 between the first semiconductor region 211 and the first portion 214a of the first source/drain electrode 214. Also, the first silicide film 212 may be disposed to surround the first conductive barrier 213 between the first semiconductor region 211 and the first conductive barrier 213. The second portion 214b of the first source/drain electrode 214 may cover at least a portion of an upper surface of the first conductive barrier 213. To this end, a diameter of the second portion 214b of the first source/drain electrode 214 may be greater than that of the first portion 214a. The structure described above of the first source/drain structure 210 may be equally applied to the second source/drain structure 240.

The first and second conductive barriers 213 and 243 may include a conductive 2D material including at least one selected from graphene, black phosphorus, amorphous boron nitride, 2D hexagonal boron nitride, and phosphorene. Then, even when the first and second conductive barriers 213 and 243 have a curved shape as shown in FIG. 3, the first and second conductive barriers 213 and 243 may be formed to be thin, and physical and/or chemical stability thereof may be ensured. The first and second conductive barriers 213 and 243 may be formed by, for example, directly depositing a carbon source on surfaces of the first and second silicide films 212 and 242 by using a plasma deposition method.

Figure 4:
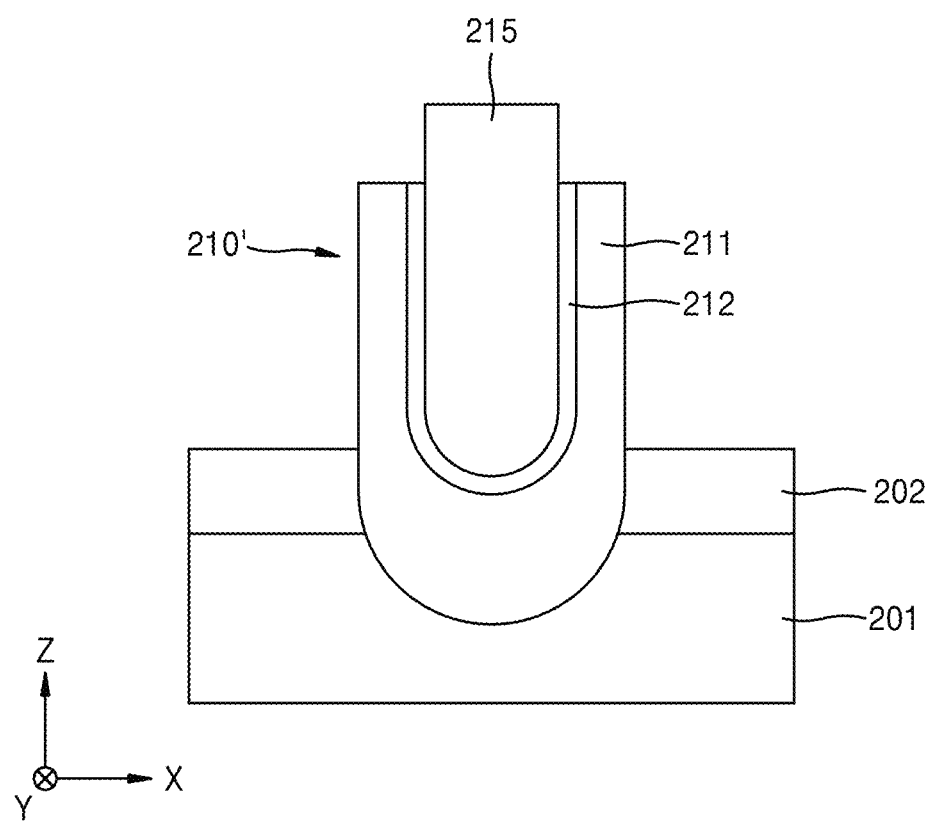
FIG. 4 is a schematic cross-sectional view illustrating another example structure of a first source/drain structure of the semiconductor device illustrated in FIG. 2.

FIG. 4 is a schematic cross-sectional view illustrating another example structure of a first source/drain structure 210' of the semiconductor device 200 shown in FIG. 2. Referring to FIG. 4, the first source/drain structure 210' may include a first semiconductor region 211, a first source/drain electrode 215 disposed to partially penetrate an interior of the first semiconductor region 211, and a first silicide film 212 disposed to surround the first source/drain electrode 215 between the first semiconductor region 211 and the first source/drain electrode 215. The first source/drain electrode 215 may include a conductive 2D material. In this case, the first source/drain electrode 215 may include the same 2D material as the conductive barrier and may be considered to be integrally formed with the conductive barrier. The configuration of the first source/drain structure 210' illustrated in FIG. 4 may also be applied to the second source/drain structure 240.

Figure 5:
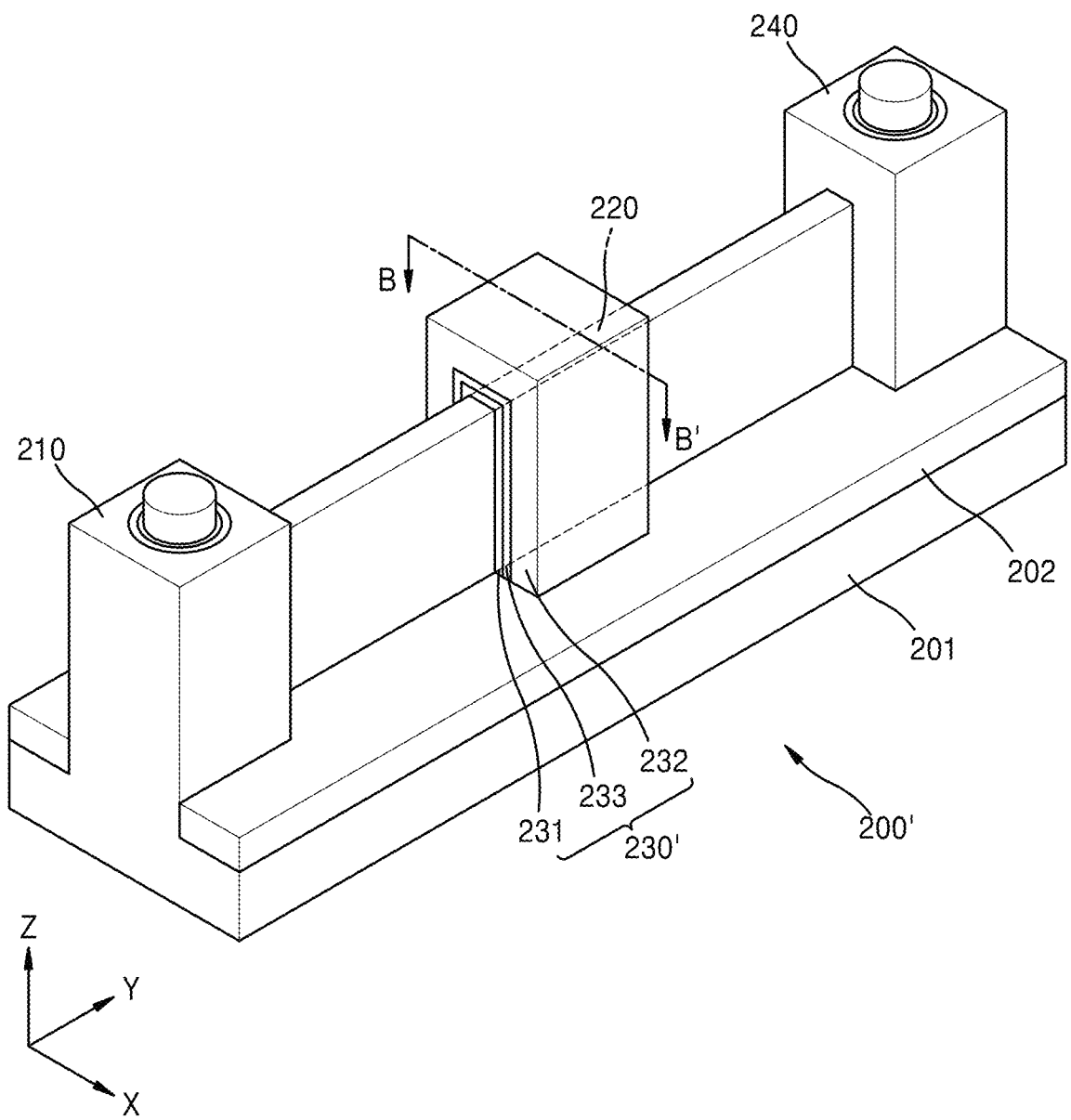
FIG. 5 is a schematic perspective view illustrating a structure of a semiconductor device according to another embodiment.
Figure 6:
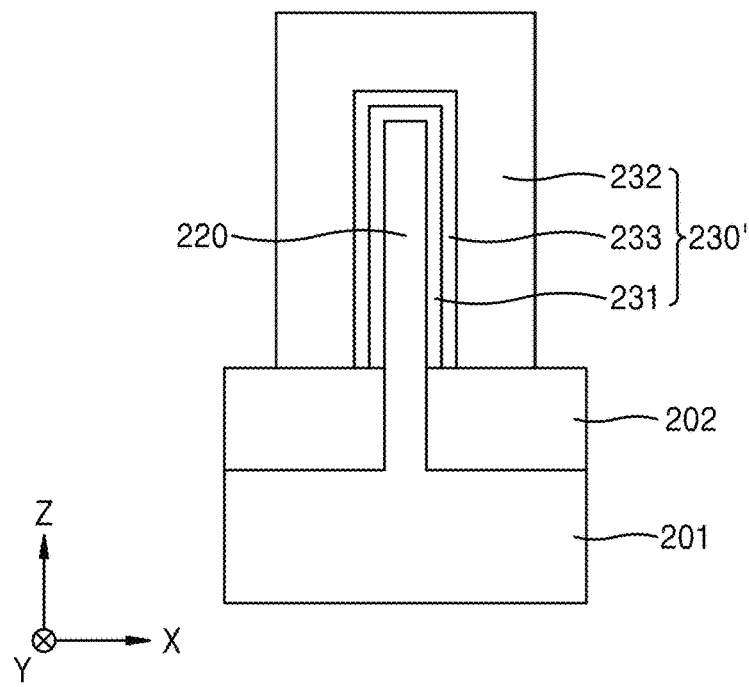
FIG. 6 is a schematic cross-sectional view illustrating an example structure of a gate structure of the semiconductor device shown in FIG. 5.

FIG. 5 is a schematic perspective view illustrating a structure of a semiconductor device according to another embodiment. FIG. 6 is a schematic cross-sectional view illustrating an example structure of a gate structure of the semiconductor device shown in FIG. 5, in particular a schematic cross-sectional view taken along line B-B' of the gate structure of FIG. 5. Referring to FIGS. 5 and 6, the semiconductor device 200' may include a gate structure 230' including a 2D semiconductor material layer 233 disposed between the gate insulating film 231 and the gate electrode 232. The 2D semiconductor material layer 233 of the gate structure 230' is disposed between the gate insulating film 231 and the gate electrode 232 and is configured to surround both side surfaces and an upper surface of the gate insulating film 231, and the gate electrode 232 may be disposed to protrude from an upper surface of the substrate 201 to cover both side surfaces and an upper surface of the 2D semiconductor material layer 233. Because the remaining configuration of the semiconductor device 200' except for the gate structure 230' is the same as that of the semiconductor device 200 illustrated in FIGS. 2 and 3, detailed description of the remaining configuration of the semiconductor device 200' is omitted.

The 2D semiconductor material layer 233 may adjust a threshold voltage of the semiconductor device 200'. The 2D semiconductor material layer 233 may include a 2D material doped to have a semiconductor characteristic or a 2D material having a semiconductor characteristic by itself. For example, the 2D semiconductor material layer 233 may be formed by doping graphene, 2D hexagonal boron nitride, black phosphorus, phosphorene, etc. to have a semiconductor characteristic. Alternatively, the 2D semiconductor material layer 233 may include, for example, a transition metal dichalcogenide. The transition metal dichalcogenide may include a metal element selected from the group consisting of Mo, W, Nb, V, Ta, Ti, Zr, Hf, Tc, Re, Cu, Ga, In, Sn, Ge and Pb and a chalcogen element selected from the group consisting of S, Se, and Te. When the 2D semiconductor material layer 233 is disposed to overlap the gate electrode 232, the work functions of the 2D semiconductor material layer 233 and the gate electrode 232 may be reduced. Accordingly, a threshold voltage of the semiconductor device 200' may be adjusted. The thickness of the 2D semiconductor material layer 233 in the X-direction may be 3 nm or less, 2 nm or less, or 1 nm or less, and may be 0.3 nm or more.

Figure 7:
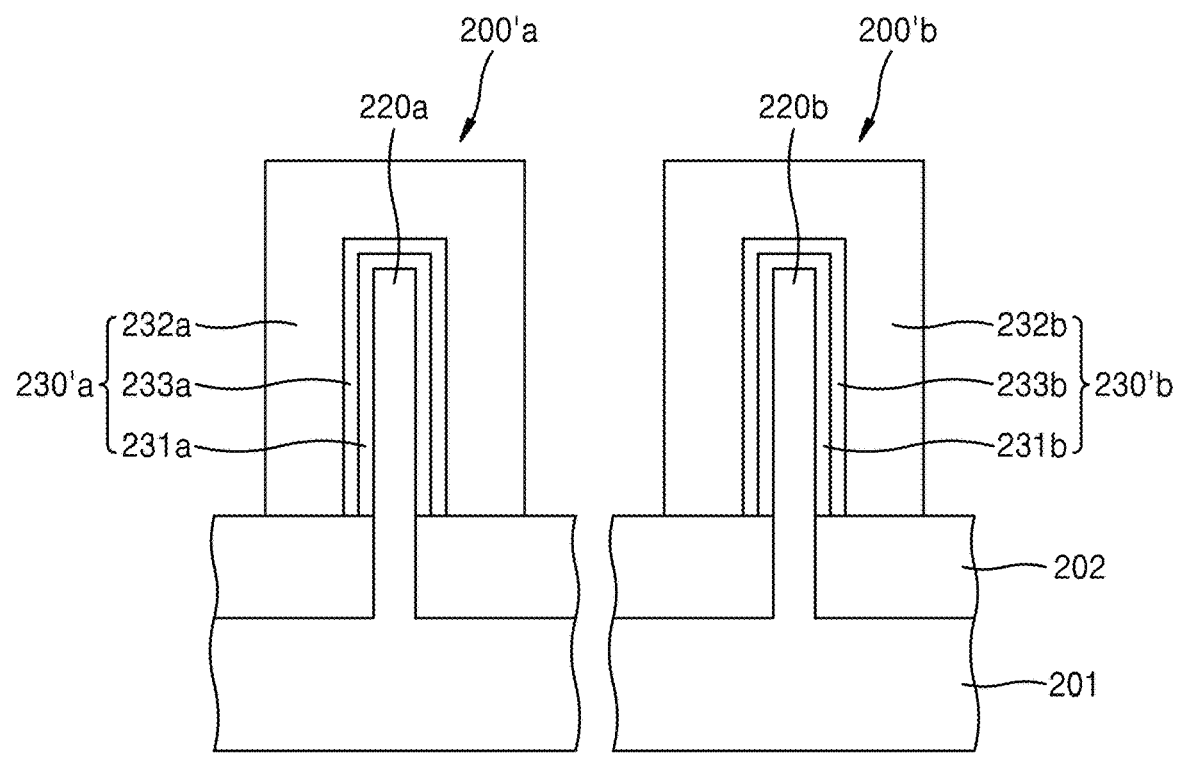
FIG. 7 is a schematic cross-sectional view showing another example structure of a gate structure of the semiconductor device shown in FIG. 5.

FIG. 7 is a schematic cross-sectional view showing another example structure of a gate structure of the semiconductor device 200' shown in FIG. 5. Referring to FIG. 7, at least two independent semiconductor devices 200'a and 200'b may be used together. For example, the first semiconductor device 200'a may be an NMOS and the second semiconductor device 200'b may be a PMOS. The first semiconductor device 200'a may include a first channel 220a and a first gate structure 230'a, and the second semiconductor device 200'b may include a second channel 220b and a second gate structure 230'b. Although not shown, each of the first and second semiconductor devices 200'a and 200'b may further include a first source/drain structure and a second source/drain structure having the configuration described above. In addition, the first gate structure 230'a may include a first gate insulating film 231a, a first 2D semiconductor material layer 233a, and a first gate electrode 232a, and the second gate structure 230'b may include a second gate insulating film 231b, a second 2D semiconductor material layer 233b, and a second gate electrode 232b.

The threshold voltage of the first semiconductor device 200'a and the threshold voltage of the second semiconductor device 200'b may be different from each other. In order to individually and differently adjust the threshold voltage of the first semiconductor element 200'a and the threshold voltage of the second semiconductor element 200'b, the first 2D semiconductor material layer 233a and the second 2D semiconductor material layer 233b may be different from each other. For example, the first 2D semiconductor material layer 233a and the second 2D semiconductor material layer 233b may include different 2D semiconductor materials from each other, or the thickness of the first 2D semiconductor material layer 233a and the thickness of the second 2D semiconductor material layer 233b may be different from each other. Then, the threshold voltages required by the first semiconductor device 200'a and the second semiconductor device 200'b may be adjusted without changing configurations of the first and second gate electrodes 232a and 232b.

Figure 8:
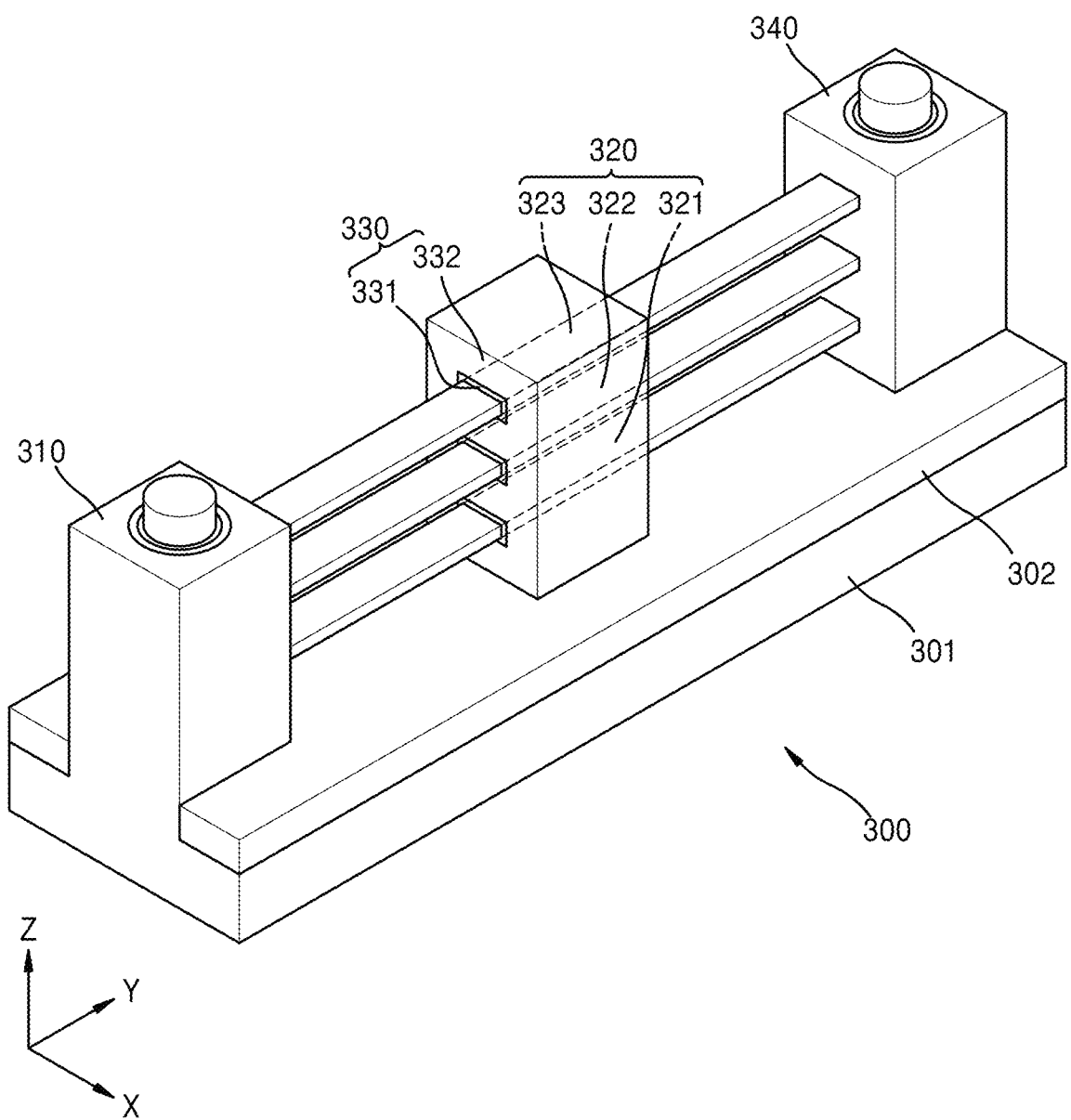
FIG. 8 is a schematic perspective view illustrating a structure of a semiconductor device according to another embodiment.

FIG. 8 is a schematic perspective view illustrating a structure of a semiconductor device 300 according to another embodiment. Referring to FIG. 8, the semiconductor device 300 includes a substrate 301, a first source/drain structure 310 protruding in the Z-direction from an upper surface of the substrate 301, a second source/drain structure 340 protruding in the Z-direction from the upper surface of the substrate 301, a channel 320 spaced apart from the upper surface of the substrate 301 and having a bar shape extending in the Y-direction, and a gate structure 330 surrounding and covering the channel 320. In addition, the semiconductor device 300 may further include a device isolation film 302 to electrically isolate the semiconductor device 300 from other adjacent semiconductor devices (not shown). The channel 320 may include a plurality of channel elements 321, 322, and 323 that are separated from each other in the Z-direction or the X-direction that is different from the Y-direction. In FIG. 8, it is depicted that the three channel elements 321, 322, and 323 are separated in the Z-direction, but this is merely an example and not necessarily limited thereto. The semiconductor device 300 illustrated in FIG. 8 may include, for example, a GAAFET or an MBCFET.

The first source/drain structure 310 and the second source/drain structure 340 may have the same structure as described with reference to FIGS. 2 and 3 or FIG. 4. Accordingly, detailed descriptions of the first source/drain structure 310 and the second source/drain structure 340 are omitted.

The gate structure 330 may include a plurality of gate insulating films 331 disposed to surround the plurality of channel elements 321, 322, and 323, respectively. Also, the gate structure 330 may include a gate electrode 332 disposed to protrude from an upper surface of the substrate 301 to surround the plurality of gate insulating films 331.

Figure 9:
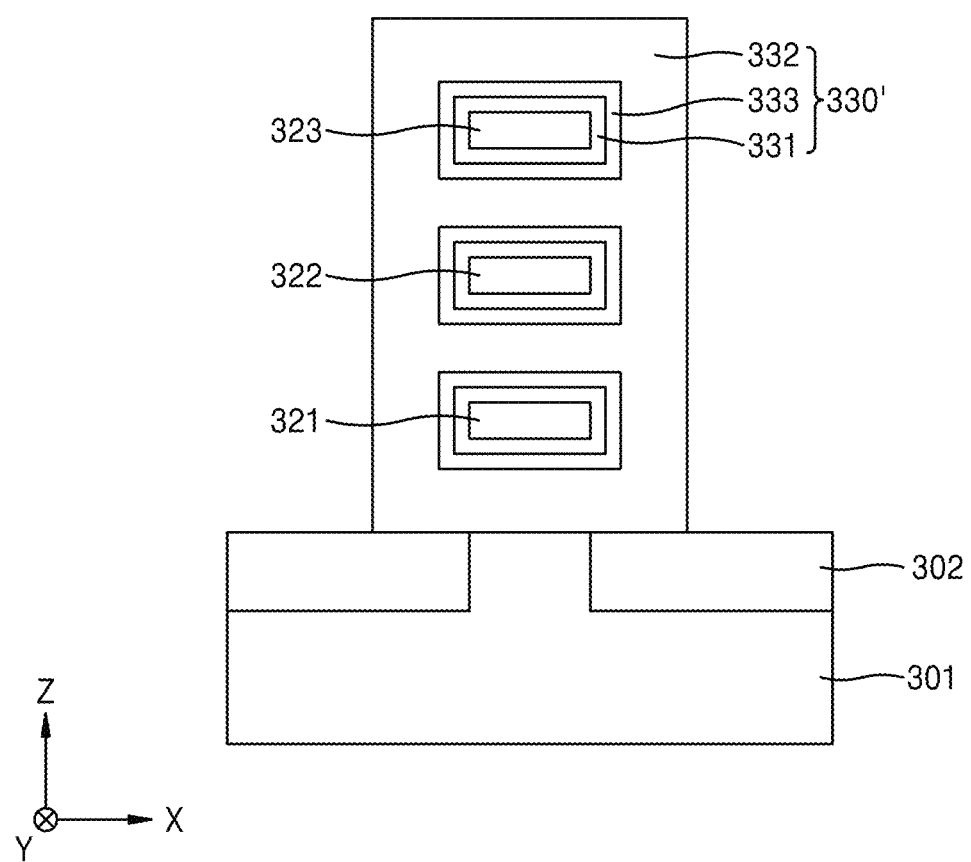
FIG. 9 is a schematic cross-sectional view showing another example structure of a gate structure of the semiconductor device shown in FIG. 8.

FIG. 9 is a schematic cross-sectional view illustrating another example structure of the gate structure 330 of the semiconductor device 300 illustrated in FIG. 8. Referring to FIG. 9, a gate structure 330' may further include a plurality of 2D semiconductor material layers 333 disposed to respectively surround the plurality of gate insulating films 331. Each of the 2D semiconductor material layers 333 may be disposed between the corresponding gate insulating film 331 and the gate electrode 332.

FIGS. 2 to 9 show examples of forming a semiconductor device by using a bulk semiconductor substrate. In this case, a channel is a central region of an upper region of the semiconductor substrate that remains after etching both upper regions of the semiconductor substrate. Instead of the bulk substrate, a semiconductor device on a silicon on insulator (SOI) substrate may be formed.

Figure 10:
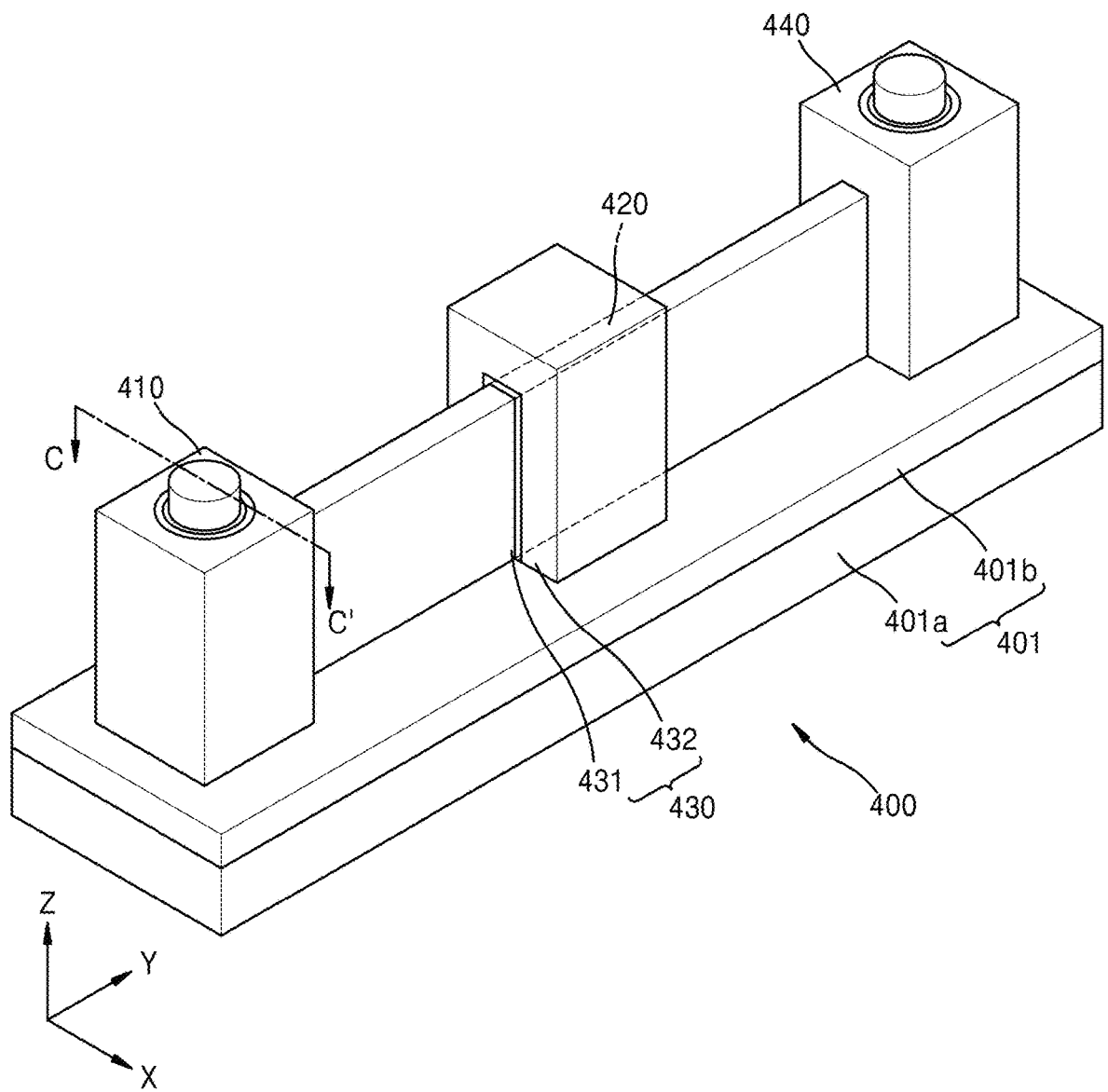
FIG. 10 is a schematic perspective view illustrating a structure of a semiconductor device according to another embodiment.
Figure 11:
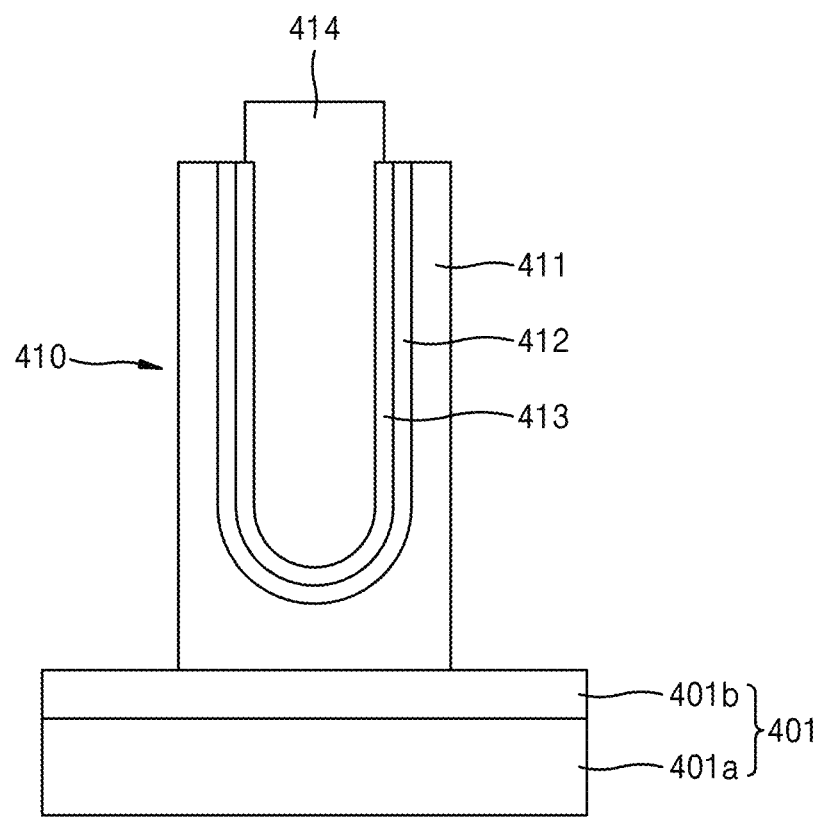
FIG. 11 is a schematic cross-sectional view illustrating an example structure of a first source/drain structure of the semiconductor device shown in FIG. 10.

FIG. 10 is a schematic perspective view illustrating a structure of a semiconductor device 400 according to another embodiment. FIG. 11 is a schematic cross-sectional view illustrating an example structure of a first source/drain structure of the semiconductor device 400 shown in FIG. 10, in particular, a schematic cross-sectional view taken along line C-C' of a first source/drain structure 410 of FIG. 10. Referring to FIGS. 10 and 11, the semiconductor device 400 according to another embodiment includes a substrate 401, a first source/drain structure 410 protruding in the Z-direction from an upper surface of the substrate 401, a second source/drain structure 440 protruding in the Z-direction from the upper surface of the substrate 401, a channel 420 protruding in the Z-direction from the upper surface of the substrate 401 and having a bar shape extending in the Y-direction, and a gate structure 430 covering and surrounding the channel 420. The substrate 401 may be an SOI substrate including a silicon layer 401a and an insulating layer 401b. The gate structure 430 may include a gate insulating film 431 and a gate electrode 432.

The first source/drain structure 410 may include a first semiconductor region 411 disposed to protrude from an upper surface of the insulating layer 401b in the Z-direction, a first source/drain electrode 414 disposed in the first semiconductor region 411, a first conductive barrier 413 disposed to surround the first source/drain electrode 414 in the first semiconductor region 411, and a first silicide film 412 disposed to surround the first conductive barrier 413 in the first semiconductor region 411. The second source/drain structure 440 may also have the same structure as the first source/drain structure 410.

The channel 420 and the gate structure 430 may also protrude in the Z-direction on an upper surface of the insulating layer 401b. Because the channel 420 and the gate structure 430 may have the same structures as those described above, detailed descriptions thereof are omitted. The first source/drain structure 410, the second source/drain structure 440, the channel 420, and the gate structure 430 may be formed by depositing on the insulating layer 401b.

The semiconductor devices described above may be used in, for example, a driving integrated circuit of a display, a complementary metal oxide semiconductor (CMOS) inverter, a CMOS static random access memory (CMOS SRAM) device, a CMOS NOT-AND (CMOS NAND) circuit, and/or various other electronic devices.

Figure 12:
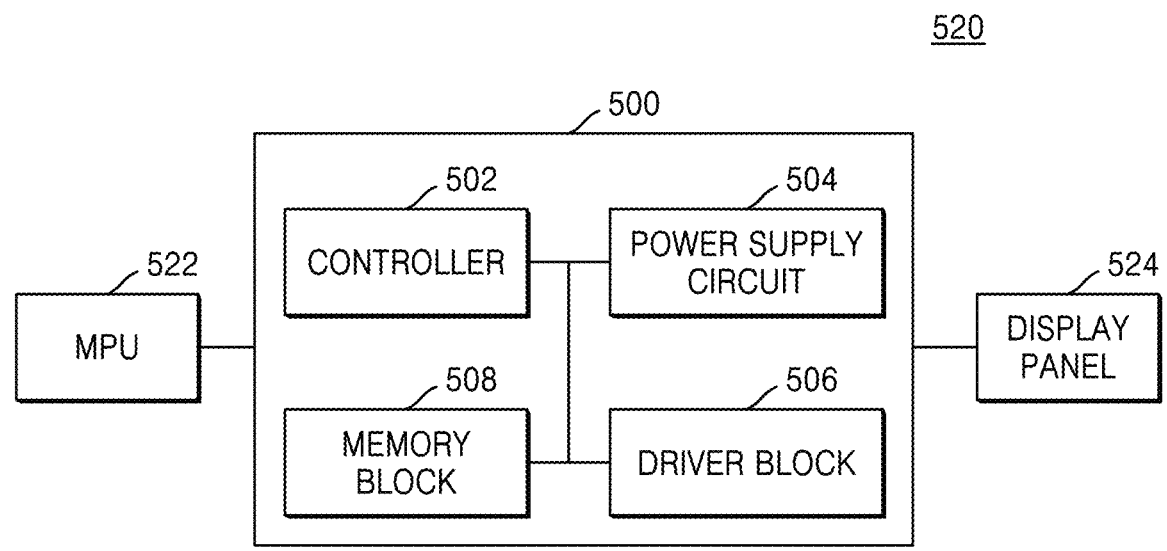
FIG. 12 is a schematic block diagram of a display driver IC (DDI) and a display device including the DDI according to an embodiment.

FIG. 12 is a schematic block diagram of a display driver IC (DDI) 500 and a display device 520 including the DDI 500 according to an embodiment.

Referring to FIG. 12, the DDI 500 may include a controller 502, a power supply circuit 504, a driver block 506, and a memory block 508. The controller 502 receives and decodes a command applied from a main processing unit (MPU) 522 and controls each block of the DDI 500 to implement an operation according to the command. The power supply circuit 504 generates a driving voltage in response to control of the controller 502. The driver block 506 drives a display panel 524 by using a driving voltage generated by the power supply circuit 504 in response to the control of the controller 502. The display panel 524 may include, for example, a liquid crystal display panel, an organic light emitting device (OLED) display panel, or a plasma display panel. The memory block 508 is a block for temporarily storing commands input to the controller 502 or control signals output from the controller 502, or for storing necessary data, and may include a memory, such as random access memory (RAM) or read only memory (ROM). The power supply circuit 504 and the driver block 506 may include any one of the semiconductor devices according to the embodiments described above with reference to FIGS. 1A to 11.

Figure 13:
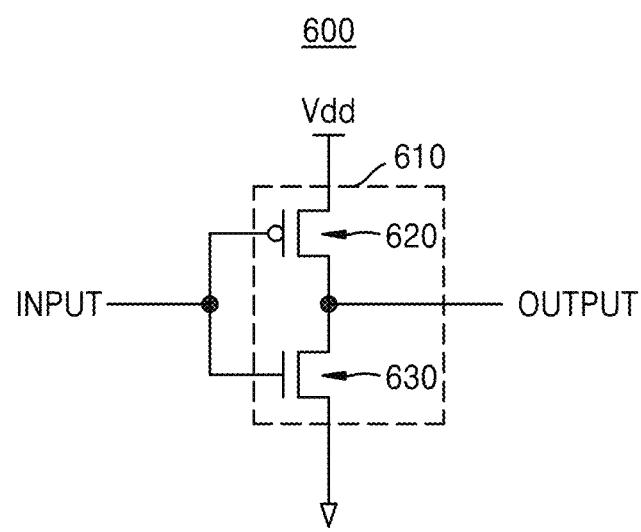
FIG. 13 is a circuit diagram of a complementary metal oxide semiconductor (CMOS) inverter according to an embodiment.

FIG. 13 is a circuit diagram of a CMOS inverter 600 according to an embodiment. Referring to FIG. 13, the CMOS inverter 600 includes a CMOS transistor 610. The CMOS transistor 610 includes a PMOS transistor 620 and an NMOS transistor 630 connected between a power terminal Vdd and a ground terminal. The CMOS transistor 610 may include any one of the semiconductor devices according to the embodiments described above with reference to FIGS. 1A to 11.

Figure 14:
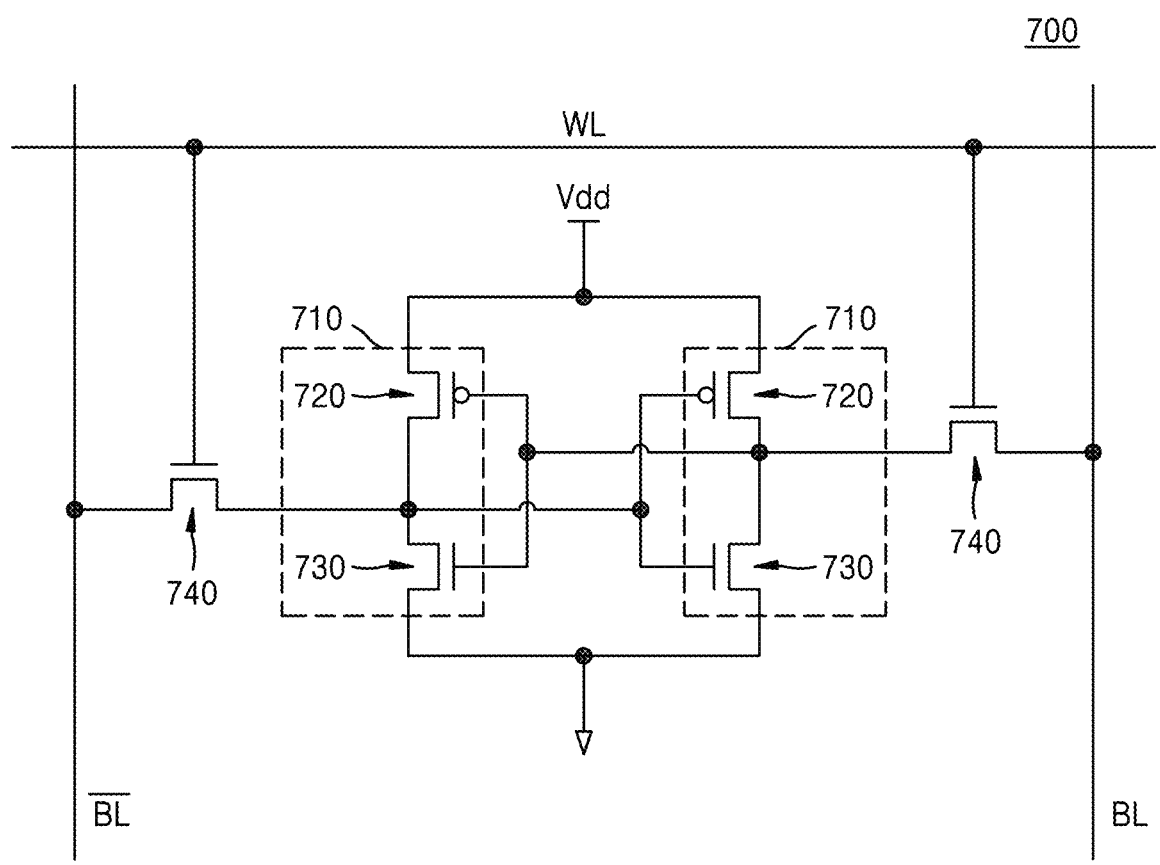
FIG. 14 is a circuit diagram of a CMOS static random access memory (CMOS SRAM) device according to an embodiment.

FIG. 14 is a circuit diagram of a CMOS SRAM device 700 according to an embodiment. Referring to FIG. 14, the CMOS SRAM device 700 includes a pair of driving transistors 710. The pair of driving transistors 710 includes a PMOS transistor 720 and an NMOS transistor 730 connected between a power terminal Vdd and a ground terminal, respectively. The CMOS SRAM device 700 may further include a pair of transmission transistors 740. A source of the transmission transistor 740 is cross-connected to a common node of the PMOS transistor 720 and the NMOS transistor 730 constituting the driving transistor 710. A power terminal Vdd is connected to a source of the PMOS transistor 720, and a ground terminal is connected to a source of the NMOS transistor 730. A word line WL may be connected to a gate of the pair of transmission transistors 740, and a bit line BL and an inverted bit line may be connected to a drain of each of the pair of transmission transistors 740, respectively. At least one of the driving transistor 710 and the transmission transistor 740 of the CMOS SRAM device 700 may include any one of the semiconductor devices according to the embodiments described above with reference to FIGS. 1A to 11.

Figure 15:
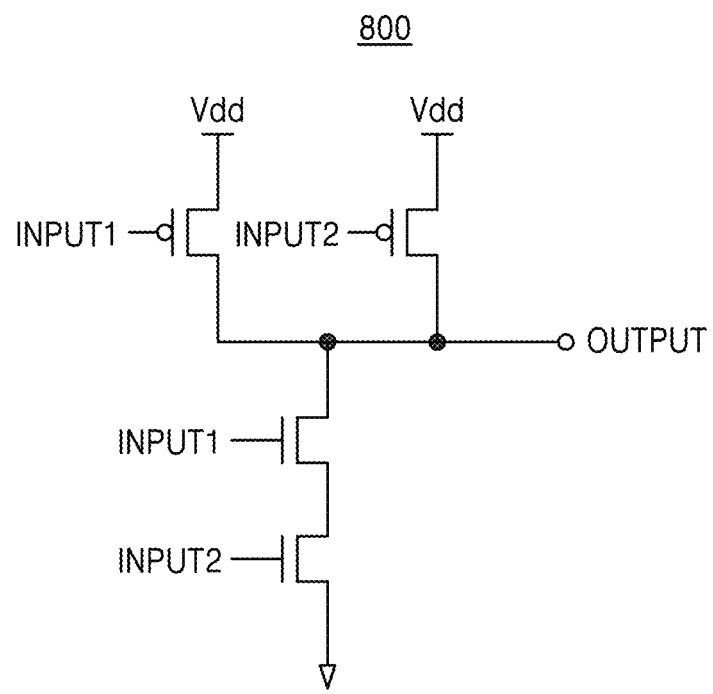
FIG. 15 is a circuit diagram of a CMOS NOT-AND (CMOS NAND) circuit according to an embodiment.

FIG. 15 is a circuit diagram of a CMOS NAND circuit 800 according to an embodiment. Referring to FIG. 15, the CMOS NAND circuit 800 includes a pair of CMOS transistors to which different input signals are transmitted. The CMOS NAND circuit 800 may include any one of the semiconductor devices according to the embodiments described above with reference to FIGS. 1A to 11.

Figure 16:
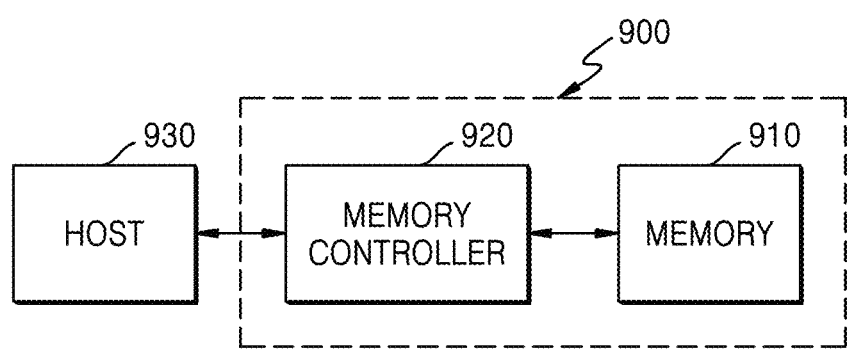
FIG. 16 is a block diagram illustrating an electronic apparatus according to an embodiment.

FIG. 16 is a block diagram illustrating an electronic apparatus 900 according to an embodiment. Referring to FIG. 16, the electronic apparatus 900 includes a memory 910 and a memory controller 920. The memory controller 920 may control the memory 910 to read data from and/or write data into the memory 910 in response to a request from the host 930. At least one of the memory 910 and the memory controller 920 may include any one of the semiconductor devices according to the embodiments described above with reference to FIGS. 1A to 11.

Figure 17:
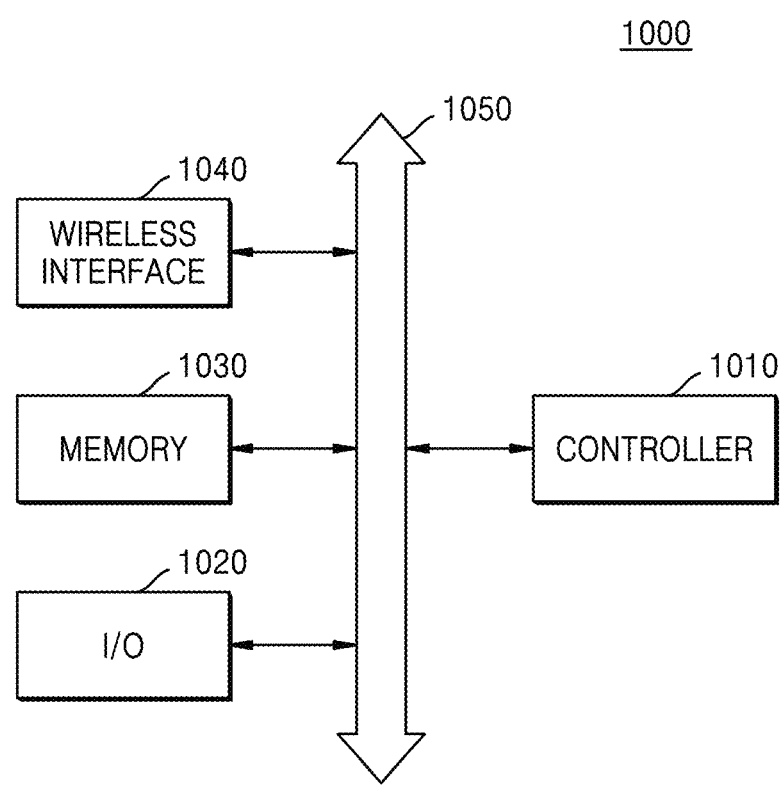
FIG. 17 is a block diagram of an electronic apparatus according to an embodiment.

FIG. 17 is a block diagram of an electronic apparatus 1000 according to an embodiment. Referring to FIG. 17, the electronic apparatus 1000 may constitute a wireless communication device or a device capable of transmitting and/or receiving information in a wireless environment. The electronic apparatus 1000 includes a controller 1010, an input/output (I/O) device 1020, a memory 1030, and a wireless interface 1040, and these components are interconnected to each other through a bus 1050.

The controller 1010 may include at least one of a microprocessor, a digital signal processor, and a processing device similar thereto. The I/O device 1020 may include at least one of a keypad, a keyboard, and a display. The memory 1030 may be used to store instructions executed by controller 1010. For example, the memory 1030 may be used to store user data. The electronic apparatus 1000 may use the wireless interface 1040 to transmit/receive data through a wireless communication network. The wireless interface 1040 may include an antenna and/or a wireless transceiver. In some embodiments, the electronic apparatus 1000 may be used in a communication interface protocol (e.g., a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system and the like). The electronic apparatus 1000 may include any one of the semiconductor devices according to the embodiments described above with reference to FIGS. 1A to 11.

The semiconductor device according to the embodiments may exhibit high electrical performance with an ultrasmall structure, and thus may be applied to an integrated circuit device, and may realize miniaturization, low power, and high performance.

While

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:
1. A semiconductor device comprising:
a first source/drain structure including a first semiconductor region and a first electrode in electrical contact with the first semiconductor region;
a second source/drain structure including a second semiconductor region and a second electrode in electrical contact with the second semiconductor region;
a channel between the first semiconductor region and the second semiconductor region; and
a gate structure including a gate insulating film covering the channel and a gate electrode covering the gate insulating film, wherein the first source/drain structure further includes a silicide film and a conductive barrier, the silicide film is between the first semiconductor region and the first electrode, the conductive barrier is between the silicide film and the first electrode, and the conductive barrier includes a conductive two-dimensional material, wherein the first electrode includes a same two-dimensional material as the conductive barrier, and the first electrode is integrally formed with the conductive barrier.

2. The semiconductor device of claim 1, wherein a thickness of the conductive barrier is in a range of about 0.3 nm to about 2 nm.

3. The semiconductor device of claim 1, wherein the first electrode includes at least one of W, Co, Cu, Ru, Mo, Rh, Ir, and an alloy thereof.

4. The semiconductor device of claim 1, wherein the silicide film includes a mixture of silicon and at least one of W, Ti, Co, Ni, Pt, and an alloy thereof.

5. The semiconductor device of claim 1, wherein the conductive two-dimensional material includes at least one of graphene, black phosphorus, amorphous boron nitride, two-dimensional hexagonal boron nitride (h-BN), and phosphorene.

6. The semiconductor device of claim 1, further comprising:
a substrate, wherein
the first semiconductor region and the second semiconductor region protrude from an upper surface of the substrate.

7. The semiconductor device of claim 6, wherein the first electrode includes a first portion located inside the first semiconductor region and a second portion protruding above an upper surface of the first semiconductor region.

8. The semiconductor device of claim 7, wherein the conductive barrier surrounds the first portion of the first electrode, the conductive barrier is between the first semiconductor region and the first portion of the first electrode, the silicide film surrounds the conductive barrier, and the silicide film is between the first semiconductor region and the conductive barrier.

9. The semiconductor device of claim 7, wherein a diameter of the second portion of the first electrode is greater than a diameter of the first portion of the first electrode so that the second portion of the first electrode covers at least a portion of an upper surface of the conductive barrier.

10. The semiconductor device of claim 6, wherein the channel protrudes from the upper surface of the substrate and has a shape extending in a first direction.

11. The semiconductor device of claim 10, wherein the first electrode extends in a second direction that is different from the first direction.

12. The semiconductor device of claim 10, wherein the gate insulating film surrounds side surfaces of the channel and an upper surface of the channel, and the gate electrode is disposed to surround side surfaces of the gate insulating film and an upper surface of the gate insulating film.

13. The semiconductor device of claim 12, wherein the gate structure further includes a two-dimensional semiconductor material layer disposed between the gate insulating film and the gate electrode, the two-dimensional semiconductor material layer surrounds the side surfaces of the gate insulating film and the upper surface of the gate insulating film, and the gate electrode surrounds side surfaces of the two-dimensional semiconductor material layer and an upper surface of the two-dimensional semiconductor material layer.

14. The semiconductor device of claim 6, wherein the channel is spaced apart from the upper surface of the substrate, and the channel extends in a first direction.

15. The semiconductor device of claim 14, wherein the channel includes a plurality of channel elements spaced apart a distance from each other in a second direction that is different from the first direction.

16. The semiconductor device of claim 15, wherein the gate insulating film includes a plurality of gate insulating films spaced apart from each other and respectively surrounding the plurality of channel elements.

17. The semiconductor device of claim 16, wherein the gate electrode protrudes from the upper surface of the substrate and surrounds the plurality of gate insulating films.

18. An electronic apparatus comprising:
the semiconductor device of claim 1.

19. A semiconductor device comprising:
a substrate;
a first source/drain structure including a first semiconductor region and a first electrode in electrical contact with the first semiconductor region;
a second source/drain structure including a second semiconductor region and a second electrode in electrical contact with the second semiconductor region;
a channel between the first semiconductor region and the second semiconductor region; and
a gate structure including a gate insulating film covering the channel and a gate electrode covering the gate insulating film, wherein
the first source/drain structure further includes a silicide film and a conductive barrier,
the silicide film is between the first semiconductor region and the first electrode,
the conductive barrier is between the silicide film and the first electrode, and
the conductive barrier includes a conductive two-dimensional material,
wherein:
the first semiconductor region and the second semiconductor region protrude from an upper surface of the substrate,
the channel is spaced apart from the upper surface of the substrate, and
the channel extends in a first direction,
the channel includes a plurality of channel elements spaced apart a distance from each other in a second direction that is different from the first direction,
the gate insulating film includes a plurality of gate insulating films spaced apart from each other and respectively surrounding the plurality of channel elements,
the gate structure further includes a plurality of two-dimensional semiconductor material layers respectively surrounding the plurality of gate insulating films, and the gate electrode protrudes from the upper surface of the substrate and surrounds the plurality of two-dimensional semiconductor material layers.

20. A semiconductor device comprising:
a first source/drain structure and a second source/drain structure spaced apart from each other and connected to opposite ends of a channel,
the first source/drain structure and the second source/drain structure respectively including a first silicide film on a first semiconductor region and a second silicide film on a second semiconductor region, a first electrode electrically connected to the first silicide film and a second electrode electrically connected to the second silicide film, and a first conductive barrier between the first electrode and the first silicide film and a second conductive barrier between the second electrode and the second silicide film,
the first conductive barrier and the second conductive barrier including a conductive two-dimensional material; and
a gate structure on the channel and spaced apart from the first source/drain structure and the second source/drain structure, the gate structure including a gate electrode and a gate insulating film between the gate electrode and the channel,
wherein the first electrode includes a same conductive two-dimensional material as the conductive barrier, and the first electrode is integrally formed with the first conductive barrier.

21. The semiconductor device of claim 20, wherein the conductive two-dimensional material includes at least one of graphene, black phosphorus, amorphous boron nitride, two-dimensional hexagonal boron nitride (h-BN), and phosphorene.

22. The semiconductor device of claim 20, wherein
the first semiconductor region surrounds the first silicide film, and
the second semiconductor region surrounds the second silicide film.

23. The semiconductor device of claim 20, further comprising:
a substrate, wherein
the first semiconductor region, the channel, and the second semiconductor region protrude from an upper surface of the substrate,
the first semiconductor region surrounds the first electrode,
the second semiconductor region surrounds the second electrode, and
the gate electrode surrounds the channel.

24. The semiconductor device of claim 20, wherein
the channel includes a plurality of channel elements spaced apart from each other.

* * * * *